United States Patent

Hanoka et al.

[11] Patent Number: 5,151,377
[45] Date of Patent: Sep. 29, 1992

[54] METHOD FOR FORMING CONTACTS

[75] Inventors: Jack I. Hanoka, Brookline; Scott E. Danielson, Stoneham, both of Mass.

[73] Assignee: Mobil Solar Energy Corporation, Billerica, Mass.

[21] Appl. No.: 666,334

[22] Filed: Mar. 7, 1991

[51] Int. Cl.[5] .................................. H01L 31/18
[52] U.S. Cl. ............................... 437/2; 437/180; 437/188; 136/256; 346/140 R
[58] Field of Search ........... 427/74, 372.2, 229, 427/96; 437/2-5, 180, 188; 136/256

[56] References Cited

U.S. PATENT DOCUMENTS

| | | | |
|---|---|---|---|
| 3,964,139 | 6/1976 | Kleinmann et al. | 24/254 |
| 4,219,448 | 8/1980 | Ross | 252/500 |
| 4,235,644 | 11/1980 | Needes | 136/256 |
| 4,278,831 | 7/1981 | Riemer et al. | 136/256 |
| 4,336,281 | 6/1982 | Van Mourik | 427/74 |
| 4,451,969 | 6/1984 | Chaudhuri | 437/2 |
| 4,485,387 | 11/1984 | Drumheller | 346/140 R |
| 4,661,368 | 4/1987 | Rohde et al. | 427/8 |
| 4,664,945 | 5/1987 | Maeda et al. | 427/96 |
| 4,692,351 | 9/1987 | Maeda et al. | 427/196 |
| 4,720,798 | 1/1988 | Reed et al. | 364/489 |
| 4,737,197 | 4/1988 | Nagahara et al. | 136/256 |
| 4,762,578 | 8/1988 | Burgin, Jr. et al. | 156/64 |

FOREIGN PATENT DOCUMENTS

| | | | |
|---|---|---|---|
| 58-27375 | 2/1983 | Japan | 136/256 |
| 1-39079 | 2/1989 | Japan | 136/256 |

OTHER PUBLICATIONS

A. Blakers et al., *J. Vac. Sci. Technol.*, vol. 20, No. 1, Jan. 1982, pp. 13-15.

*Primary Examiner*—Aaron Weisstuch
*Attorney, Agent, or Firm*—Pandiscio & Pandiscio

[57] ABSTRACT

A method and apparatus are provided for forming grid electrodes for solar cells, the method and apparatus essentially involving dispensing a viscous ink through a hollow pen tip onto a selected horizontally oriented solar cell blank, so that the discharged ink forms a ribbon or line on the blank, with the pen tip being spaced far enough above the solar cell blank so that it does not ride on the deposited ribbon or line, whereby the width and height of the written ribbon or line are not determined by the o.d. of the pen tip or any pressure exerted by the pen tip.

10 Claims, 5 Drawing Sheets

METHOD FOR FORMING CONTACTS

This invention relates to photovoltaic solar cells and more particularly to the formation of contacts ("electrodes") on the front radiation-receiving sides of the cells.

BACKGROUND OF THE INVENTION

Photovoltaic solar cells essentially comprise a semiconductor substrate of one conductivity type having a shallow P-N junction formed adjacent the front surface thereof The cells require electrical contacts (also called "electrodes") their front and rear sides in order to be able to obtain electrical current from the cells when they are exposed to solar radiation. The contact on the front of the solar cell is generally made in the form of a grid, comprising a plurality of narrow, elongate parallel fingers that extend in one direction, and at least one elongate bus that intersects the fingers at a right angle. The width, number and spacing of the fingers are arranged so as to expose an optimum area of the front surface of the cell to incident solar radiation.

In order to improve the conversion efficiency of the cells, a thin anti-reflection coating consisting of a material such as silicon nitride or an oxide of silicon or titanium is provided on the front sides of the cells. The anti-reflection coating may be applied before or after the electrode has been formed.

Widespread use of solar cells is desirable but has been handicapped by cost, reliability and efficiency factors. The efforts to provide efficient cells with long term reliability at an acceptable cost are complicated by the nature of the substrate and the interrelationship of the various process steps and parameters. Thus, for example, in an effort to reduce the cost of solar cells, it has been deemed desirable to use relatively low-cost polycrystalline ribbons or sheet material instead of single crystal silicon. Accordingly, efforts have been made to develop fabrication techniques whereby efficient and reliable solar cells may be produced from EFG-grown silicon substrates which are polycrystalline. However, EFG substrates tend to have surface irregularities and also may have silicon carbide particles on their surfaces. Therefore it is essential to have a method of producing electrical contacts that is not sensitive to surface irregularities in order to maximize cell yield and efficiency. The steps of forming the front and rear contacts are a critical part of the manufacturing process; the contacts must be capable of being formed relatively inexpensively without physically damaging the brittle EFG substrates and without any deterioration of the P-N junction or cell performance.

Various materials have been used as electrical contacts for photovoltaic solar cells, the most common being aluminum, silver, and nickel. A common arrangement with silicon solar cells is to make the rear contact of aluminum and the front contact of silver.

One prior art method of forming a grid electrode involves applying a conductive metal paste onto the front surface of the substrate in a clearly defined grid pattern, firing that paste so as to form a bonded ohmic electrical contact, and then applying an anti-reflection coating to the front surface of the solar cell. Another common procedure is to first form an anti-reflection coating on the front surface, then etch away portions of that coating so as to expose portions of the front surface of the substrate in a grid electrode pattern, and thereafter deposit or otherwise form the front contact on the front surface in the region where the anti-reflection coating has been etched away.

Still another approach is the so-called "fired through" method which consists of the following steps: (1) form an anti-reflection coating on the front surface of the solar cell, (2) apply a coating of a metal/glass frit ink or paste onto the anti-reflection coating in a predetermined pattern corresponding to the configuration of the desired grid electrode, and (3) fire the paste at a temperature and for a time sufficient to cause the metal/glass composition to dissolve the anti-reflection coating and form an ohmic contact with the underlying front surface of the substrate. The "fired through" method of forming contacts is illustrated by PCT Patent Application Publication WO 89/12321, published Dec. 14, 1989, based on U.S. application Ser. No. 205,304, filed Jun. 10, 1988 by Jack Hanoka for An Improved Method Of Fabricating Contacts For Solar Cells, now abandoned, and refiled as a continuation-in-part of U.S. application Ser. No. 07/607,883, filed Nov. 1, 1990, the concept of firing metal contacts through an anti-reflection dielectric coating also is disclosed in U.S. Pat. No. 4,737,197, issued to Y. Nagahara et al for "Solar Cell With Metal Paste Contact".

Both thin film and thick film techniques have been used for the formation of electrical contacts on solar cells. Thin film manufacturing techniques include vapor deposition, sputtering, and electroless plating. Thin film manufacturing techniques permit the formation of pure metal contacts, with the result that the contacts exhibit excellent electrical properties. However, thin film techniques are costly or have environmental problems.

Thick film technology involves using a suitable paste or viscous ink to form a relatively thick metal-containing film on a substrate, and then firing that film so as to make an electrically conductive layer that is strongly bonded to the substrate. Screen printing, pad printing and the so-called "direct write" technique are among the ways of forming thick film components on semiconductor substrates.

Representative of commercially available direct writing systems in use prior to this invention is the "Micropen" machine sold by Micropen, Inc. of Pittsford, N.Y., USA, which apparently is based on the writing apparatus described and illustrated in U.S. Pat. No. 4,485,387, issued Nov. 27, 1984 to Carl E. Drumheller, for "Inking System For Producing Circuit Patterns". While such systems are capable of writing grid patterns on cambered and uneven substrates, they are not satisfactory for forming grid contacts on solar cells on a production line basis for various reasons, including inability to maximize the aspect ratio of the fingers (the aspect ratio is the ratio of finger height to finger width), an insufficient reduction in the cost of solar cell manufacture, and high capital equipment cost due to the complexity of the equipment which includes computer controls and software designed to promote real-time dynamic pen position control. Still other limitations exist when forming contacts on poylcrystalline substrates that have surface irregularities such as ripples and bumps caused by silicon carbide particles, e.g., EFG-grown silicon substrates.

An essential consideration is the need for development of a contact-forming technique that can be integrated into a mass-production manufacturing process. An ideal contact-forming process is one that is continuous rather than a batch-type operation.

A long-standing goal of solar cell makers has been to achieve the ability to form front grid-type contacts with tall as well as narrow fingers. Making the fingers narrow is desirable to minimize light shadowing (i.e., to expose as much as possible of the front surface of the solar cell to solar radiation). Increasing the height of the fingers without a corresponding increase in finger width is desirable so that the current-carrying capacity of the fingers is maximized. Another long-standing goal has been to reduce the cost of manufacturing grid contacts. The latter goal involves the task of increasing the rate at which the contacts are formed. While the contacts may be formed in a single operation, the differences in the widths and functions of the bus bars and finger elements makes it feasible to form the bus bars and fingers in two separate operations. Formation of suitable bus bars can be accomplished satisfactorily using various techniques, such as screen printing or pad printing. Accordingly formation of the finger elements is the primary factor limiting the rate at which the grid contacts can be formed, since it is essential that the fingers have a narrow but optimim width, without sacrificing electrode quality or reliability.

OBJECTS AND SUMMARY OF THE INVENTION

Accordingly, a primary object of the invention is to provide an improved method and apparatus for forming grid contacts on solar cells.

Another primary object of this invention is to provide an improved method and apparatus for forming the narrow finger elements of a grid-shaped electrical contact for a semiconductor device.

Still another primary object o this invention is to provide an improved method and apparatus for producing solar cells.

Another object is to provide an improved apparatus for direct writing of electrical circuits on semiconductor substrates, and more particularly for directly writing grid electrodes on solar cell substrates.

A further object is to provide an improved method and apparatus for direct writing narrow line electrical circuit elements on a substrate such as a solar cell blank with a viscous ink that does not involve the use of a vertically moveable ink-dispensing pen whose vertical position relative to the substrate is influenced by viscous forces on the ink, as required by U.S. Pat. No. 4,485,387.

A more specific object is to provide an improved method and apparatus for directly writing narrow lines of a viscous metal-containing ink on a substrate such as a solar cell blank, characterized by the use of an ink-dispensing pen that is mounted at a fixed height above the substrate, with the distance between the pen and the substrate greatly exceeding the height of the ink lines that are to be written on the substrate.

A further object is to provide an improved method and apparatus for direct writing of contacts on solar cell blanks using a viscous ink, wherein a catenary of the viscous ink is formed between the pen and the blanks as the blanks and the pen undergo relative motion parallel to the plane of the substrates.

Another important object is to provide solar cells with grid contacts having finger elements with a high aspect ratio.

These and other objects hereinafter rendered obvious are achieved by a method and apparatus hereinafter described and claimed that essentially involves dispensing a viscous ink through a dispensing pen tip onto a selected horizontally oriented semiconductor substrate, so that the discharged ink forms a ribbon or line on the substrate, with the pen tip being spaced far enough from the substrate so that it does not ride on the deposited ribbon or line.

THE DRAWINGS

SPECIFIC DESCRIPTION OF THE INVENTION

As used herein the term "solar cell blank" means a semiconductor substrate having a shallow P-N junction formed adjacent one surface thereof, with that surface being uncoated or else coated with an insulating coating, e.g., an anti-reflection coating made of a material such as silicon nitride or an oxide of silicon or titanium. By way of example but not limitation, a solar cell blank may consist of an EFG-grown silicon substrate of P-type conductivity having a P-N junction located about 0.5 microns from its front surface, with the front surface having a silicon nitride coating with a thickness of about 800 Angstroms.

Also, as used herein, the terms "ribbon" and "line" are used to distinguish the ink that has been laid down onto the solar cell blank from the stream of ink that is delivered to and dispensed from the pen tip.

The present invention is based on the idea of using the direct write concept and a fireable metal/glass frit paste or ink to form grid electrodes on solar cell blanks. However, although the invention is intended primarily for formation of the thin elongate finger elements of grid-type front solar cell contacts, it is to be appreciated that it may also be used to form the relatively wide bus bar elements of the grid contacts or circuit elements for other semiconductor devices.

The direct writing system disclosed by U.S. Pat. No. 4,485,387 comprises an ink dispenser ("pen") having a pen tip of predetermined outer diameter ("o.d.") and a writing discharge orifice of predetermined diameter (usually about one-half the tip o.d.) that is mounted for reciprocal vertical movement by an electromagnetic transducer. The substrate or other specimen on which a circuit or circuit element is to be printed is mounted horizontally on an X-Y translating table located below the ink dispenser. The X-Y table causes horizontal movement of the substrate or other specimen whereby the pen tip member may write selectively in the X or Y direction. The pen is movable along the vertical (Z) axis under control of a computer, the electromagnetic transducer, and other components of the system. The ink is dispensed under the force of a pump and its rheological properties are such that it will form a narrow ribbon or line as it contacts the substrate. The pen rides on the dispensed ink ribbon or line during the writing operation. As the substrate and pen undergo relative movement in the X-Y directions, the pen tends to move up and down according to undulations in the substrate. This movement is sensed by an infra-red detector which in turn causes an electrical signal to be applied to the electromagnetic transducer so as to cause it to apply a raising or lowering force to the pen for the purpose of keeping constant the pressure of the pen on the ink and also the thickness of the ink applied to the substrate.

Figure 1A:
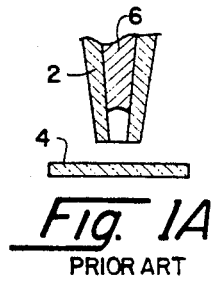
FIG. 1A-1F illustrate the mode of operation of a prior art direct writing system.
Figure 1B:
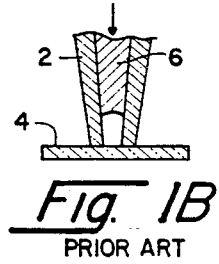
Figure 1C:
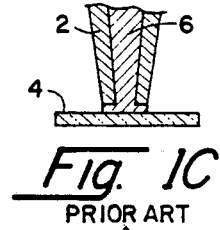
Figure 1D:
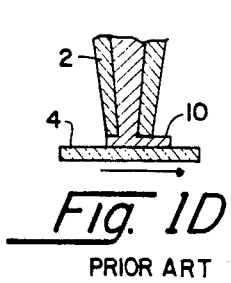
Figure 1E:
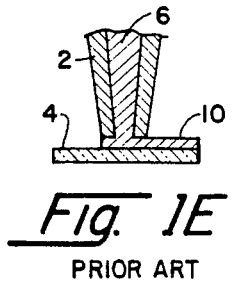
Figure 1F:
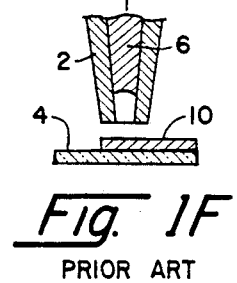

FIGS. 1A-1F illustrate the mode of operation of prior art direct writing equipment such as that which embodies the invention disclosed in U.S. Pat. No. 4,485,387. In FIG. 1A, the pen 2 is elevated above the substrate 4 which is mounted on an X-Y positioning table (not shown), and the ink 6 is withdrawn into the pen by the ink pumping system (also not shown) so that it will not drip. In FIG. 1B, the pen is lowered into proximity with the substrate and the pen position is noted by the system. At the same time, the ink-dispensing pump (not shown) is operated so as to cause dispensing of ink. In FIG. 1C, ink is extruded from the pen, causing the pen to rise. The raised position of the pen is noted by the feedback control pen-positioning system, which in turn applies a pre-set vertically-directed force to the pen. In FIG. 1D, the X-Y table starts to undergo motion along the X or Y axis, as desired, and the pump speed is adjusted to cause the pen to write a line or ribbon 10. When the writing is complete (FIG. 1E), the table is stopped and the pump is shut off. Thereafter as illustrated in FIG. 1F, the pen is lifted and the ink is withdrawn into the pen tip so as to prevent any dripping of ink from the pen.

In the foregoing procedure, the pen does not directly contact the substrate except initially before any writing has commenced (FIG. 1B); however once writing starts, the pen rides on the surface of the extruded ink ribbon or line 10.

With conventional direct write systems of the type exemplified by FIGS. 1A-1F, the width (the horizontal dimension) of the ribbon or line that is laid down onto the substrate is determined at least in part by (1) the outer diameter ("o.d.") of the pen tip and (2) the pressure exerted on that ribbon by the pen tip, since the pen tip is in direct contact with the ribbon of ink that has been formed on the substrate. The height of the printed ribbon or line is determined in part by the ink viscosity and in part by the fact that the pen tip is riding on the printed ribbon or line of ink.

While the pen tips may be made of a ceramic such as alumina or a metal or metal alloy such as titanium carbide, tungsten carbide, and stainless steel, commercially available direct write systems normally use hollow pen tips made of a ceramic such a alumina because of cost and also the ability to withstand wear from the ink-dispensing action. The pen tips are ground to a fine point, and then their ends are ground flat so as to achieve a desired o.d. For the task of forming thin finger elements for a grid contact having a finger width in the range of 0.003-0.010 inch, the pens may need to be ground to an o.d. of 3-10 mils (0.003-0.010 inch), in which case the discharge orifice typically has a diameter in the order of 2.0-6 mils. These small diameter pen tips are easily damaged. Thus, if a ceramic pen tip or nozzle encounters a silicon carbide particle as it is writing a grid line on a silicon substrate, the extreme hardness of the silicon carbide will tend to cause a portion of the pen tip to be sheared off, with the result that the pen tip may be rendered less effective or even useless. Additionally, although such machines can write narrow fingers at relatively high writing speeds, e.g., 4 inches/second, problems are encountered if the bus bars have been pre-printed on the blanks. In such event, the writing speed must be reduced, e.g., to 0.5 inch/second or less, in order to avoid a "line skip" as hereinafter described.

A major problem with using a direct writing system of the kind that operates in the manner shown in FIGS. 1A-1F to form grid electrode elements on EFG silicon solar cell blanks is that, at writing speeds of 1.0 inch/second or higher, ripples and surface bumps, such as are produced by silicon carbide peaks on the blanks, may cause the pen to jump. When the pen jumps, it may cause the ink stream to neck down enough to break momentarily, thus causing the pen to write a discontinuous line on the blank, i.e., a "line skip". Alternatively, the pen may jump so as to cause the ink to neck down just enough to cause the ribbon to undergo a reduction in cross-sectional size, including line width.

Direct writing systems of the kind illustrated in FIGS. 1A-1F are handicapped by the foregoing limitations and also from the fact that they can write only one line at a time.

Another problem with direct writing systems of the kind that operate in the manner shown in FIGS. 1A-1F stems from the fact that the electromagnet transducer which controls the force on the tip as it rides over the surface of the ink is required to be calibrated each time any changes are made to the machine set up, such as ink or pen tip changes.

Figure 2:
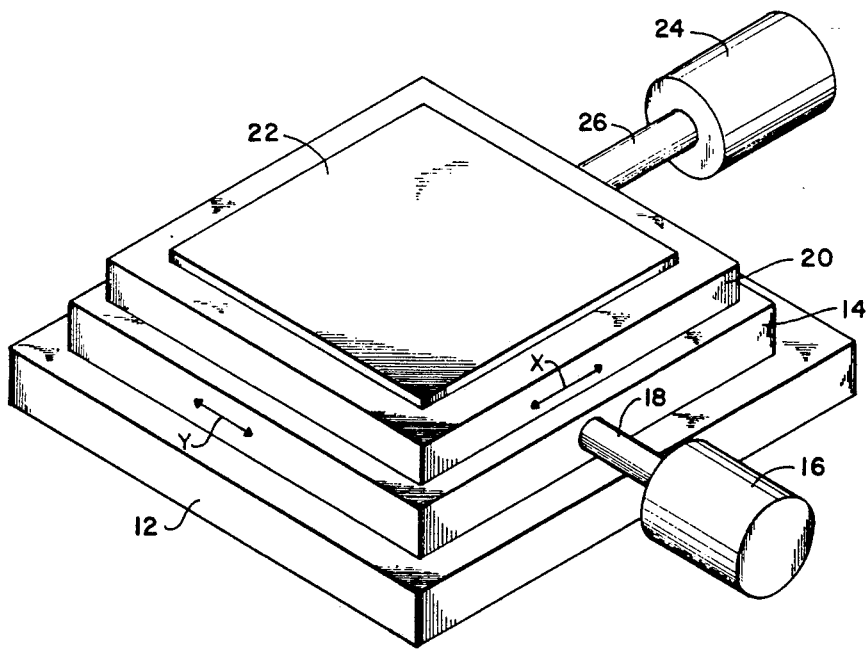
FIG. 2 is a schematic perspective view of an X-Y translating table that comprises part of the apparatus of the present invention.

FIG. 2 schematically illustrates a conventional X-Y translator table forming part of the printing machine of the present invention. The X-Y translator table comprises a bottom or first table member 14 which is mounted for rectilinear movement on a support member 12 for translation in the so called Y-axis direction. The connection between table member 14 and support member 12 is such as to prohibit any relative movement along the X-axis while permitting movement along the Y-axis. Movement of bottom table member 14 is controlled by a suitable translating mechanism which is schematically illustrated as an actuator 16 having an operating shaft or connecting rod 18 coupled to table member 14. Mounted on and coupled to bottom table member 14 is an upper table member 20 that carries a work-support plate 22 on which solar cell blanks (substrates) 50A-50H (FIG. 4) are positioned for the direct writing operation. Support plate 22 is provided with suitable anchoring means (not shown) for releasably holding one or more solar cell blanks in a predetermined position along its X-axis and also its Y-axis Upper table member 20 is mounted so as to be capable of rectilinear movement along the X-axis relative to bottom table member 14, while being held against any relative movement along the Y-axis. Movement of upper table member 20 is achieved by an appropriate translating mechanism which is represented schematically as an actuator 24 having a connecting rod or operating shaft 26 connected to the upper table member. Actuators 16 and 24 may take various forms depending on how they are connected to the lower and upper table members 14 and 20. Thus, for example, actuators 16 and 24 may be electrical motors which are connected to the lower and upper table members by means of a screw mechanism arranged so that as the motor shafts rotate in one direction or the other, the shafts or rods 18 and 26 will be moved so as to cause table members 14 or 20 to reciprocate along the Y-axis and X-axis respectively. Other suitable mechanisms for selectively moving table members 14 and 20 are well known to persons skilled in the art, since X-Y translating tables are old articles of commerce.

Figure 3:
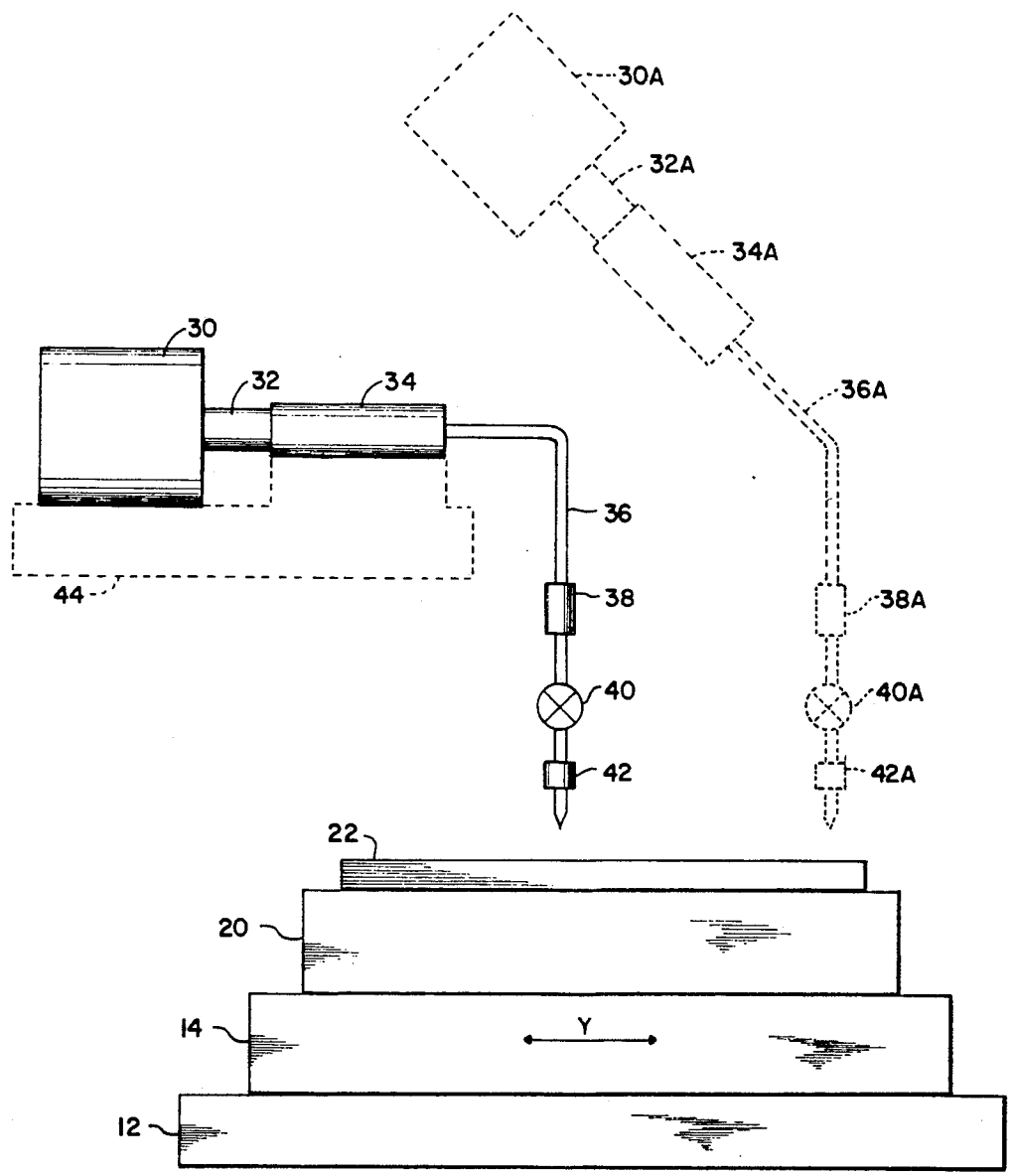
FIG. 3 is a schematic side elevation of the X-Y translating table of FIG. 2 in association with an ink-dispensing system provided in accordance with the present invention.

FIG. 3 illustrates schematically the remainder of the apparatus which forms part of and is used in the practice of the present invention. The illustrated apparatus comprises a positive-displacement pump 30 which is mechanically coupled to a syringe-type ink feeder mechanism comprising a syringe plunger or piston 32 disposed in telescoping relation with a syringe tube or cylinder 34 that serves as an ink supply reservoir. Cylinder 34 is filled with an ink comprising fine particles of a selected metal such as silver and a glass frit, and a fluid vehicle in which the metal and glass frit particles are dispersed. Cylinder 34 is connected by a conduit 36 to a micro filter 38 which in turn is connected to an On-Off valve 40. The latter in turn is coupled by suitable conduit means to a hollow pen tip 42. The distance between micro-filter 38 and pen tip 42 is kept relatively short, preferably not exceeding about 2-3 inches. The foregoing apparatus is mounted to a suitable support illustrated schematically at 44. Support 44 secures the pen tip against freedom of movement along the X, Y, and Z axes. However, the support may include adjusting mechanisms (not shown) to permit the position of the pen to be selectively adjusted along at least the Z-axis (the vertical axis), whereby distance between the pen tip and the solar blank(s) supported on the X-Y table assembly may be varied as desired. More preferably, the support may also include other adjusting mechanisms (not shown) to permit the position of the pen to be adjusted horizontally along the X and Y axes relative to the X-Y table assembly for initial registration purposes. The discharge end of pen tip 42 is located at a predetermined distance above the substrates that are supported on work support plate 22. Preferably the pen is mounted so there is a gap in the range of 0.25 inches to 0.75 inches between its discharge end and the solar cell blanks on work support plate 22. However, the pen tip may be positioned as close as 0.10 inch and as far as 1.0 inch from the solar cell blank.

It has been determined that it is essential to use an ink with a maximum particle size of about 10-20 microns in order to write fingers with a truly fine line width, e.g, a line width less than 0.010 inches, that also have the desired electrical characteristics. However, when using electrically-conductive inks (such as silver or nickel inks) having a maximum particle size of about 10-20 microns to write fingers with a width of 0.003-0.010 inch, there is a tendency of the ink to clog the pen's discharge orifice.

It appears that a substantial amount of clogging is caused by a tendency of the particles in the ink to agglomerate and form clusters of particles with a size close to or exceeding the diameter of the pen tip orifice. It has been found that the clogging problem can be reduced or substantially eliminated by use of a suitable micro-filter 38.

Figure 6:
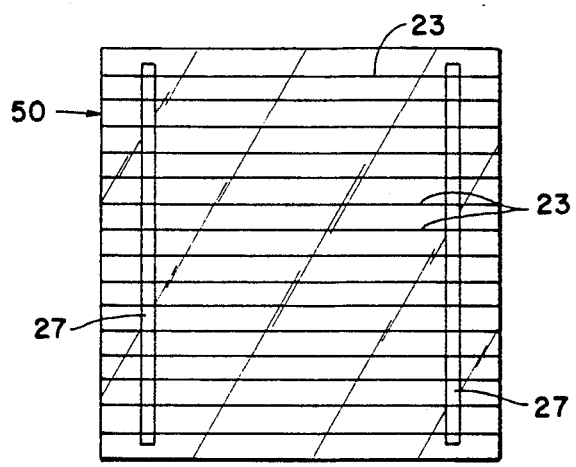
FIG. 6 is a plan view of a solar cell blank illustrating a grid electrode made by use of the present invention.

Various commercially available filters may be used as filter 38. By way of example, filter 38 may be of the kind that comprises a sintered metal filter element or a metal mesh filter element. For producing fine line grid contact finger elements as shown in FIG. 6 having a line width of 0.010 inch or less, the filter should have a pore size that will enable it to remove particles that measure in excess of 40-140 microns. An advantage of such a filter is that it causes shear thinning of the viscous ink, and that shear thinning is believed to contribute to a reduction in the clogging frequency of the ink.

Figure 4:
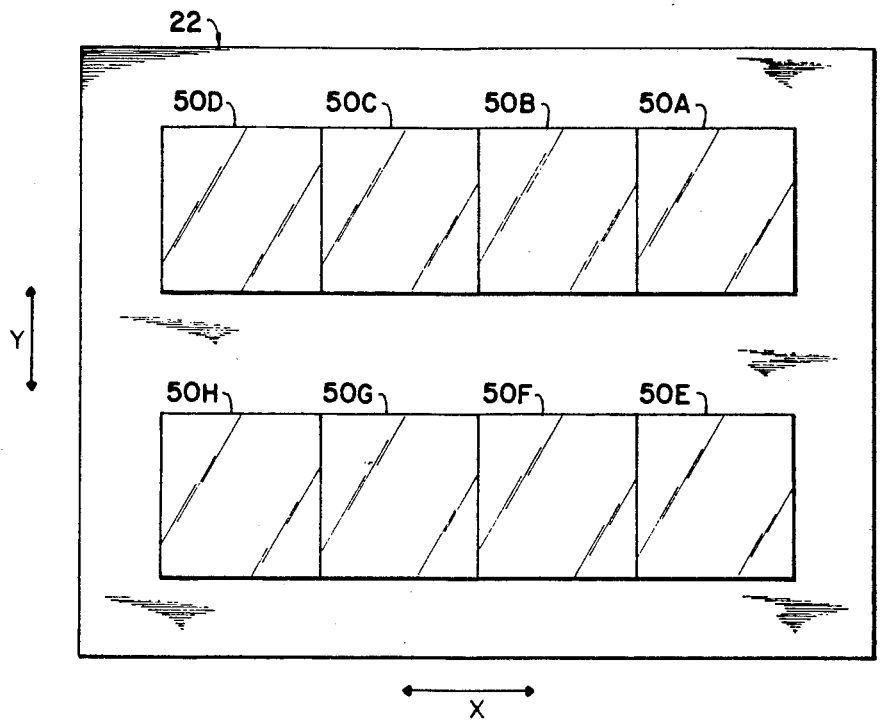
FIG. 4 is a plan view illustrating how two rows of solar cell blanks are mounted on the X-Y translating table of FIG. 2.

Although the invention may be practiced using a single pen to write on a single solar cell blank at a time, it is contemplated that two or more pens may be used for writing grid contact finger elements on two solar cell blanks simultaneously, in which case the work table must be large enough to support two or more arrays of solar cell blanks (as shown in FIG. 4) so as to cause printing of grid electrode finger elements on solar cell blanks in each array simultaneously. Accordingly, the apparatus may be modified by providing (as shown in dotted lines in FIG. 3) a second like printing ink dispensing assembly comprising pump 30A, piston 32A, cylinder 34A, conduit 36A, filter 38A, On-Off valve 40A, and pen tip 42A.

In FIG. 4, two rows of silicon solar cell blanks 50 A-D and 50 E-H are shown mounted on the support plate 22 in two discrete rows arranged along the X axis of the X-Y table. When using two arrays of cell blanks as shown in FIG. 4, and two pens, as shown at 42 and 42A (FIG. 3) the pens and cell blanks are spaced so that fingers are printed at identical locations on two cells simultaneously.

In the practice of this invention, it is contemplated that the ink dispensing system may continue to dispense ink without interruption between the completion of one finger element and the beginning of the printing of the next finger element. In such an arrangement the On-Off valves 40 and 40A are used only to terminate ink flow when grid printing operations are suspended or terminated. The solar cell blanks in each row may be located in abutting relation to each other as shown in FIG. 4, or in each row the blanks may be spaced from one another. In the latter case, although not shown, it is to be understood that a suitable ink-interfering mask may be positioned in relation to the solar cell blanks so as to confine the writing to the blanks and avoid deposition of the continuously-flowing ink onto blank support 22 or the X-Y table.

Figure 5:
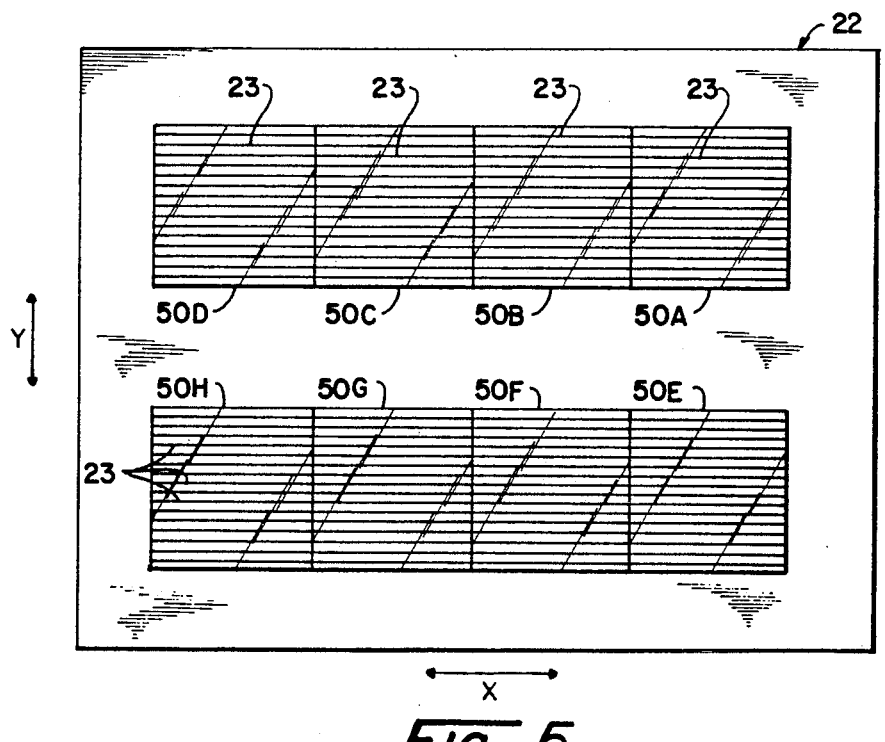
FIG. 5 illustrates the same solar cell blanks after being printed with grid electrode finger elements using the apparatus of FIGS. 2 and 3.

Further with respect to FIGS. 2-5, the two pens 42 and 42A are positioned so that with the X-Y table in a predetermined "Start" position, dispensing of ink from pens 42 and 42A will cause fingers to be formed simultaneously on corresponding solar cell blanks in the first and second rows 50A-D and 50E-H respectively. The X-Y table is considered to be in its "Start" position when Y table member 14 is disposed at one end of its possible path of movement and X table member 20 is disposed at one end of its possible path of movement. As ink is dispensed from the two pen tips 42 and 42A, the X table member 20 is moved along the X axis in a first direction, with its movement being great enough to cause a finger element 23 to be printed on each of the four cell blanks 50A-50D by pen 42, and a like finger element 23 to be printed on each of the cell blanks 50E-H by pen 42A. Preferably the fingers extend for the full length of the solar cell blanks as shown in FIG. 5 (it is to be noted that if the fingers are to terminate short of one or both edges of the blanks, a mask may be used to prevent ink from being deposited on those marginal areas). As X table member 20 reaches the end of its stroke in said first direction and before it commences its return stroke in a second opposite direction, the Y table member 14 is indexed along the Y axis a distance equal to the desired spacing between fingers, and then the X table member 20 is reciprocated in the second opposite direction back to its initial start position, causing the two pens to form a second finger element on each of the cells 50A–H. When the X table member has returned to its original position and before it begins to repeat its stroke in the first direction, the Y table member 14 is indexed a second time along the Y axis a distance equal to the desired spacing between fingers, and then the X table member is again reciprocated in the second opposite direction away from its start position, causing the pens to form a third finger element on each of the cell blanks 50A–H. This procedure is repeated until a predetermined number of fingers have been formed along the entire width (the Y dimension) of the solar cell blanks, as shown in FIG. 5.

As illustrated in FIG. 6, the solar cell blanks 50 are also provided with a pair of bus bars 27 which are much wider than the finger elements 23. The bus bars are formed in an operation separate from the finger-writing operation. They may be formed in various ways, e.g., by a direct writing method or by silk screening or pad printing.

Although it is possible to print the bus bars after the fingers, it is preferred that the bus bar printing occur before fingers are formed according to the present invention. Forming the bus bars before the finger elements is critical if a machine such as the one disclosed in U.S. Pat. No. 4,485,387 is used to form the bus bars. That machine can be programmed so as to write a plurality of narrow parallel ink lines that overlap one another so as to form a relatively wide bus bar. However, because that machine is sensitive to undulations in the surface height of the substrates, it is not practical for it to form bus bars unless the bus bars are written before the fingers are formed. The reason is that if the fingers are formed first, the system will have to be operated at a relatively slow rate in order to afford the pen tip control system adequate time to sense the changes in elevation caused by the occurrence of the fingers, so as to permit it to move the pen tip up and down as it passes over each finger, and also to avoid damage to the fingers by the pen tip.

It is preferred that the bus bars have a width in the range of 0.030 to 0.050 inches an that the fingers have a width of 0.003 to 0.010 inches, although a finger width greater than 0.010 inch may be acceptable for some purposes. The spacing between the fingers is selected so as to provide the optimum compromise between the shadowing effect of the fingers and their current-carrying capability.

Figure 7:
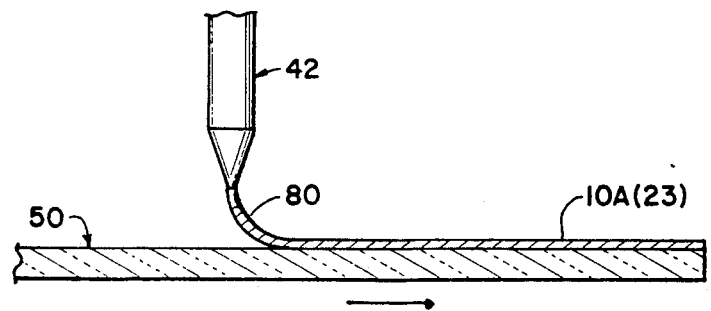
FIG. 7 is a schematic view in side elevation showing how ink is dispensed onto a substrate according to the present invention.

Referring now to FIG. 7, an essential aspect of this invention is the ability to write circuit elements with a substantially higher aspect ratio than was possible heretofore. As indicated above, in printing with a machine such as the one disclosed in U.S. Pat. No. 4,485,387, the height of the ink which is deposited onto the substrate is influenced by the fact that the pen tip is in contact with the ink ribbon on the substrate and actually applies a downward force on that ink ribbon. Accordingly as the ink ribbon moves out from under the pen, or vice-versa, the shape assumed by the ribbon is determined by the surface tension of the ink, the o.d. of the pen tip, the contact angle of the ink with the substrate or solar cell blank, and also the fact that the ink ribbon was deformed by the pressure exerted by the pen tip during the extrusion process. The present invention involves a different ink-applying phenomenon. With the present invention, the pen tip 42 is at a fixed height above the solar cell blank 50 that is greatly in excess of the height of the ribbon 10A that is laid down on the substrate to form the fingers 23, so that pen tip 42 does not exert any kind of downward force on the ink ribbon. Instead a form of ink catenary 80 is produced between pen tip 42 and ribbon 10A as a result of the fact that the pen tip is spaced from the substrate.

The shape of ink catenary 80 is determined by the following factors: (a) the velocity of the ink leaving the pen tip, (b) the speed at which the substrate is moved relative to the pen, (c) the height of the pen tip relative to the substrate, and (d) the visco-elastic properties of the ink.

The fact that the extruded ink stream extending between the pen tip and the substrate is of catenary-like shape is significant in that it permits the cross-sectional shape of the printed line or ribbon to be determined primarily by the contact angle and the visco-elastic properties of the ink. As a result the present invention maximizes the height-to width aspect ratio of the formed fingers 23.

By way of comparison, if a "Micropen" machine and the apparatus shown in FIG. 2, 3 and 7 are both used to write fingers with a width of 0.0075 inch using the silver ink available commercially from Ferro Corp. under Product No. 3349, with the pen tip 42 positioned above the solar cell blank(s) by a distance in the range of 0.25 to 0.75 inch, the fingers (ribbon 10) produced by the "Micropen" machine will have a height of about 12 microns, while the fingers (ribbon 10A) produced by pen 42 will have a height of about 18–20 microns (note: the foregoing heights are the values after the fingers have been fired as hereinafter described). The greater aspect ratio of fingers formed by the present invention is advantageous because the greater thickness (the "height" dimension) of the fingers provides a greater current-carrying capacity.

The foregoing comparison is based on the use of an ink at approximately room temperature (20–25 degrees C.). However, it has been discovered that the aspect ratio may be increased substantially if the silver ink is heated. The heating may be accomplished by using an electrical heater (not shown) to heat the ink in cylinder 34 or conduit 36. The heater may take the form of an electrical heating coil or a hollow electrical heater surrounding cylinder 34 or conduit 36. By way of example, if the same Ferro No. 3349 silver ink is heated to about 45–50 degrees C. before it is discharged from pen tip 42, the aspect ratio of the fingers after firing will be increased so that the finger height is about 50 microns or greater. For reasons dictated by the characteristics of the organic vehicle of the ink, it is preferred that the ink be heated no higher than approximately 50–60 degrees C. However, it is believed that temperatures in excess of 60 degrees C. may be used depending on the ink composition. Consequently, depending on the height of the fingers desired to be attained, ink may be used at temperatures in the range of 20° C. to 60° C.

Figure 8:
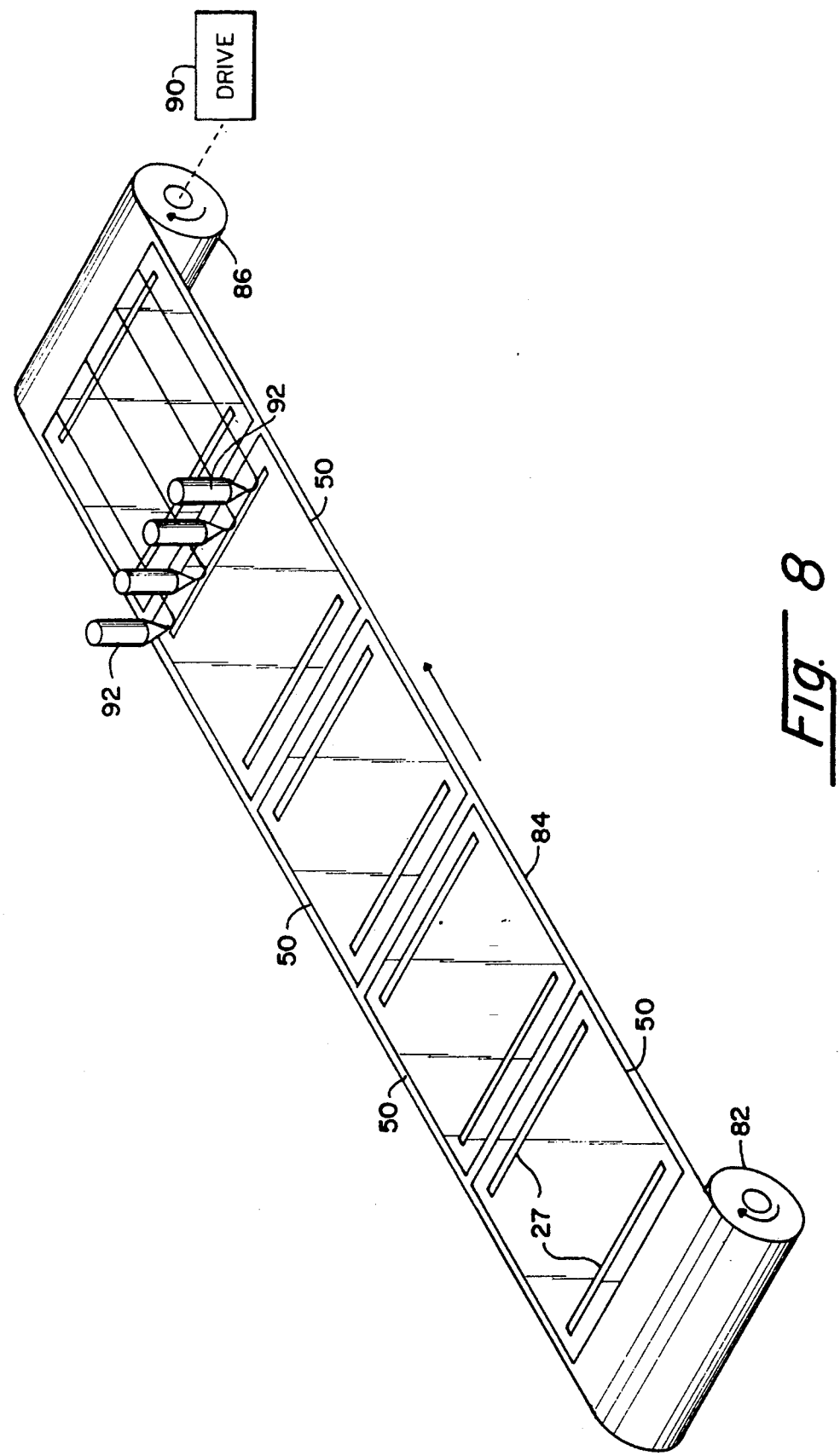
FIG. 8 is a schematic perspective view of a modification of the present invention.

FIG. 8 schematically illustrates a modification of the invention directed to the concept of continuous production. In this particular embodiment, a moving belt-type conveyor is provided for conveying solar cell blanks 50 during the direct finger writing operation. The conveyor comprises a roller 82 on which is wound an elongated web 84 made of a suitable material. That web is conveyed to and wound on a second roller 86. Alternatively the web may be replaced by an endless belt of a suitable material which is supported by a pair of rolls corresponding to the rolls 82 and 86. In either case, the web or belt may be wide enough to support only a single line of solar cell blanks; alternatively, it may be made wide enough to accommodate two or more rows of solar cell blanks extending lengthwise, similar to the dual array shown in FIG. 4. The roller 86 is coupled to a suitable unidirectional drive system 90 that causes it to turn at a controlled speed. If desired, roller 82 may be driven by a second drive system (not shown) operating in synchronism with drive system 90.

In this particular arrangement, a plurality of ink writing dispensers or pens 92 are arranged across the width of the conveyor, i.e., the "Y" dimension of the solar cell blanks, and each blank has been processed previously so as to have two bus bars 27 as shown in FIG. 6 and 8. Each pen 92 is coupled to a suitable ink delivery system, e.g., a system as illustrated in FIG. 3. Assuming that each solar cell blank is to be provided with a grid electrode comprising "n" fingers 23 (where "n" is an integer) connected by a pair of intersecting bus bars 27 as shown in FIG. 6, the apparatus of FIG. 8 would have "n" ink dispensing members positioned above the belt in position to form equally spaced fingers on each solar cell blank 50 as the cell is advanced beneath the pen tips by the moving belt. If the belt is wide enough to accommodate two parallel rows of solar cell blanks, then two like arrays of ink dispensing pens 92 would be provided so that "n" fingers would be written simultaneously on cell blanks arranged in side by side relationship across the width of the belt.

In the arrangement illustrated in FIG. 8, it is contemplated that the belt will run at a predetermined constant speed, and printing is accomplished without need for any mask, since dispensing of ink is limited in the Y direction by the fixed position of the pen tips. Ink is dispensed continuously in straight lines parallel to the X axis as the belt is conveyed, forming parallel finger elements. If the solar cell blanks are spaced from one another as shown, some of the ink will impinge on the belt in the gaps between successive blanks. However, if the solar cell blanks are maintained in abutting relationship with one another, virtually no ink will contact the belt. It is contemplated that web 84 may be an open grid-type material so that any excess ink will fall down through the conveyor to an ink-collecting system (not shown) for waste collecting purposes.

Obviously the arrangement shown in FIG. 8 may be used when the fingers are to be printed before the bus bars. Preferably, however, as illustrated in FIG. 18, the bus bars are printed first for ease of processing as well as for the other reasons stated above. In this connection, it should be noted that the first printed elements (bus bars 27 or fingers 23) may be dried before the other elements are printed. However, handling solar cell blanks with wet bus bars is easier than handling blanks with wet fingers, since the wet fingers are more susceptible to being fatally damaged by mishandling. Therefore, if the bus bars are printed first, the fingers may be written before the bus bars are subjected to drying, so as to save time and cost.

The arrangement shown in FIG. 8 offers the advantage that printing of the finger elements of the grid electrodes may be accomplished on a batch or continuous basis.

Figure 9:
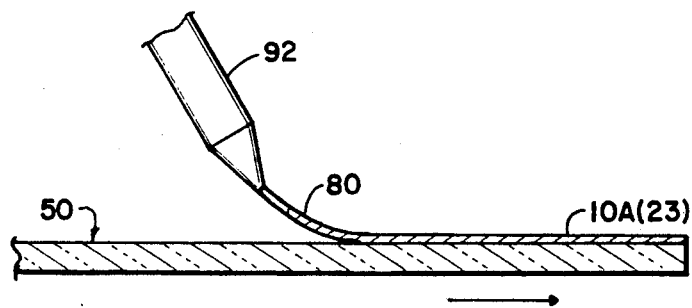
FIG. 9 is a schematic view similar to FIG. 8 showing how the ink pen may in the system of FIG. 9 may be oriented at an angle to facilitate the writing of grid electrode elements on a substrate.

FIG. 9 illustrates a modification of the apparatus of FIG. 8. In this case the ink dispensing pens 92 are inclined so that their bottom ink-discharging ends lead their top ends in the direction of movement of the solar cell blanks as they are transported along the X-axis by conveyor web or belt 84. Inclining the pen allows it to be located closer to the solar cell blank while still maintaining an ink catenary as shown.

As noted earlier, the solar cell blanks may have an anti-reflection coating on their front sides and the ink may be applied to that coating for subsequent firing through that coating to form an ohmic contact with the underlying silicon substrate.

The ink used to form the front grid contact may be a commercially available product. The printing inks found to be useful in practicing this invention contain a predetermined concentration of particles of a desired metal such as silver or nickel, a glass frit, and a vehicle that comprises an organic pyrolyzable binder and preferably an organic solvent that has a relatively low boiling point so that it can be evaporated at a relatively low temperature such as 70 degrees C. The binder may take various forms known to persons skilled in the art, including a polymerizable material. By way of example, the binder may be ethyl cellulose. Various materials may be used as a solvent, including but not limited to terpineol or Carbitol (diethylene glycol monoethyl ether).

Preferably the invention utilizes an ink or paste that contains between about 50 and 75 wt. % metal particles and between about 4 and about 15 wt. % of a glass frit, with the remainder of the ink consisting of the organic vehicle. The ink may have a viscosity in the range of 800 to 10,000 poise at room temperature (20-25 degrees C.). Inks of such nature are sometimes characterized as a thixotropic paste or a pseudoplastic material.

A frit of lead borosilicate glass or a lead silicate glass is used in the ink. The glass frit comprises 5-80 wt. % lead and up to 40 wt. % silicon oxide in the case of a lead silicate glass, and 5-80% lead, 1-40% silicon oxide and 1-30% boron oxide in the case of a lead borosilicate glass. Preferably the glass frit used is a lead borosilicate glass.

The nature of the binder and solvent are not critical to the invention except to the extent that they may affect the visco-elastic properties of the ink. The essential thing is that the solvent must be removable by evaporation at a relatively low temperature and the binder must be capable of forming a matrix to hold the metal particles after the solvent has been partially or totally evaporated and before the residual components of the ink have been fired.

By way of example but not limitation, the present invention has been used to write silver grid contacts on silicon solar cell blanks using a conventional silver screen printing ink manufactured by Ferro and identified by product No. 3349. That particular ink is believed to contain about 75 wt. % silver particles and about 5 wt % lead borosilicate glass frit, with the remainder of the ink comprising an organic vehicle comprising a pyrolyzable organic binder and a volatile solvent. It has a viscosity of about 1000 poise at 25 degrees C.

With the present invention, grid contact finger elements 23 in widths as small as 0.003 inch have been formed successfully using Ferro silver ink No. 3349 and pen tip orifices in the range of 0.002–0.010 inch, ink flow rates in the range of 0.00001 to 0.00013 in$^3$/second, an ink temperature of about 25 degrees C., a filter 38 with a 40–140 micron pore size, and a writing speed (i.e., the relative speed of movement of the X-Y table or conveyor 84 in the X-axis direction) in the range of 0.5 to 10.0 inches/second. Under such conditions, it is possible to produce finger elements 23 that have a height of about 21 microns after firing. If the foregoing process limitations are kept the same, but the ink is heated to about 50 degrees C., the fingers will have a height (thickness) of about 45–50 microns after firing.

In the case where the ink is applied directly to the silicon substrate, the firing serves to evaporate any remaining solvent, pyrolyze the organic binder and fuse the metal compound in the ink to the substrate so as to form a good ohmic contact. In the case where the ink is directed onto an insulating layer such as a silicon nitride anti-reflection coating, the firing also serves to cause the ink to dissolve the underlying silicon nitride and migrate to the front surface of the substrate, where its metal component, e.g., silver, forms an ohmic contact with the silicon substrate. The specific parameters of the firing process will vary depending upon a number of factors, including the composition of the printing ink.

Following is a specific example of a preferred mode of practicing the invention using an X-Y table as shown in FIGS. 2 and 3 to support the solar cell blanks.

EXAMPLE

Apparatus of the present invention as shown in FIGS. 2 and 3 is used in the formation of grid-type contacts on the front surfaces of solar cell blanks which take the form of polycrystalline EFG-grown silicon substrates that have a P-type conductivity and measure approximately 3.78 inches long (the "X" dimension) by approximately 3.78 inches wide ("Y" dimension). The solar cell blanks have a shallow P-N junction formed therein at a depth of about 0.5 microns below their front surfaces. The front surfaces of the solar cell blanks also are covered by an anti-reflection coating of silicon nitride with a thickness of about 800 Angstroms. Additionally the solar cell blanks have a contact made of aluminum on their rear surfaces.

One such solar cell blank at a time is mounted in a "Micropen" direct writing machine, and the latter is operated so as to write two bus bars as shown at 27 in FIG. 6 on the silicon nitride coating on the front surface of the substrates. The writing is accomplished using Ferro No. 3349 silver ink and the bus bars are formed with a width of about 0.045 inch in their as-written state.

Then, without any intervening drying step, a predetermined number of such blanks are mounted on the support plate 22 of an X-Y table unit associated with a single pen writing apparatus as illustrated in solid lines in FIG. 3. The solar cell blanks are mounted in line with one another along the X-axis of the X-Y table, and then the apparatus shown in FIGS. 2 and 3 is operated to form finger elements 23 that intersect the two bus bars as shown in FIG. 6. The pen tip is made of a ceramic such as alumina. The finger elements are written using the same Ferro No. 3349 silver ink at a temperature of 45–50 degrees C. The pen tip has a discharge orifice diameter of 0.003 inch and the pen 42 is mounted about 0.35 inch above the solar cell blanks. The ink is dispensed at a rate of about 0.000075 cubic inches/sec. The X table member 20 is moved along the X-axis so as to provide a writing speed of about 3.5 inches/second. The resulting finger elements have a width of about 0.0035 inch in their as-written state.

Then the solar cell blanks are removed from support plate 22 and dried in air at about 20–25 degrees C. Thereafter the blanks are fired for three minutes in an infra-red furnace, in an air ambient atmosphere, with the temperature being ramped up from 200° C. to a peak temperature of about 800 degrees C. and ramped back down to 200° C. The blanks are held at the peak temperature of about 800° C. for about 5 seconds. The firing causes the silver ink defining the bus bars 27 and the finger elements 23 to dissolve the underlying silicon nitride layer so that the silver component forms an an ohmic contact with the silicon substrate. The fired fingers have a width of about 0.003 inch and a height of 30–40 microns. Following the firing, the substrate is cooled to room temperature in air. Thereafter, several additional conventional fabrication steps may be performed on the substrate so as to produce a working solar cell ready to be connected to other solar cells.

Obviously the invention is susceptible of many modifications. Such things as ink composition and rheology, pen tip composition, shape and construction, ink flow rates, ink pressure, writing speed, etc. may be changed without departing from the essential character of the invention. By way of example, an ink containing nickel instead of silver may require different operating parameters. Also a single ink supply and feeding system may be used to deliver ink to two or more pens, and the filter(s) may be located between the On-Off valve 40 and the pen tip 42. Similarly the invention may be used to write other forms of circuit elements and the substrates on which writing is conducted may be made of a material other than silicon. Also the time of application of the rear (back) contact may also be changed. For example, the rear contact may be applied after the grid electrode elements have been written and dried, but before they are fired, or it may be applied after the front contact firing has occurred. The invention also may be practiced by using more than one pen to write fingers on a single solar cell blank. The solar cell blanks need not be EFG-grown substrates, but instead they may be polycrystalline silicon material made by another crystal-growing method, or even single crystal silicon material. Furthermore solar cell blanks having substrates of materials other than silicon may be used, since the present invention resides in the method and apparatus and not in the composition of the substrates per se. Still other modifications will be obvious to persons skilled in the art.

The invention has a number of advantages. First of all, it makes it possible to write finger elements with a width of 0.003–0.010 inch with a higher aspect ratio than is possible with direct writing machines of the kind disclosed by U.S. Pat. No. 4,485,387. A further advantage is that a plurality of narrow fingers can be written simultaneously. The invention also permits manufacture of grid electrodes at a lower cost than has been possible heretofore using direct writing, screen printing and pad printing techniques. A further advantage, particularly with respect to the embodiment shown in FIG. 8, is that the invention makes it possible to write a plurality of narrow fingers with on relatively large solar cell blanks, e.g., blanks measuring approximately 4.0 × 12.0 inches.

Another advantage is that the invention has been used to produce silicon solar cells using EFG substrates that have an efficiency of approximately 14%.

What is claimed is:

1. A method of forming a thick film in a predetermined circuit pattern on a substrate by depositing a viscous conductive ink thereon by means of a dispensing pen having a discharge orifice, said method comprising the following steps:

(a) disposing the pen so that its discharge orifice is directed downward;
   (b) positioning a solar cell blank so that one surface thereof is located in a horizontal plane that is spaced from said discharge orifice by an amount exceeding the desired thickness of said thick film;
   (c) dispensing a viscous conductive metal-containing ink onto said solar cell blank via said discharge orifice; and
   (d) selectively providing relative movement between said solar cell blank and said pen in at least one horizontal direction so as to cause said ink to be deposited onto said solar cell blank as a thick film in a predetermined pattern;

said pen being disposed at a fixed height above said solar cell blank as steps (c) and (d) are being performed, said fixed height being sufficiently in excess of the thickness of the ink deposited on said solar cell blank so that the discharge orifice of the pen does not ride on the deposited thick film.

2. A method according to claim 1 wherein said solar cell blank is mounted on a X-Y table that is arranged for movement along orthogonal X and Y horizontally-extending axes, and further wherein said X-Y table is moved along said X and Y axes so as to cause said paste to be deposited onto said solar cell blank in a predetermined grid pattern comprising a plurality of parallel mutually-spaced lines.

3. A method according to claim 1 wherein said pen is mounted so that its discharge orifice is spaced vertically from said solar cell blank by a distance in the range of 0.10 to 1.00 inch.

4. A method according to claim 1 wherein relative movement of said solar cell blank in said one direction is conducted at a speed in the range of 0.5 to 10.0 inches/second.

5. A method according to claim 1 wherein said solar cell blank comprises a substrate of silicon having first and second opposite surfaces with a shallow P-N junction formed adjacent said first surface, said solar cell blank is disposed with said first surface facing said discharge orifice, and said ink comprises particles of a metal and a glass frit dispersed in an organic vehicle, and further including the step of firing said blank and the ink deposited on said blank so as to cause said deposited ink to form an ohmic contact at said first surface.

6. A method according to claim 5 wherein said first surface is covered with a solid coating of an electrically-insulating material, and said ink is deposited onto said solid coating.

7. A method according to claim 6 wherein said solid coating is silicon nitride.

8. A method according to claim 7 further including the step of firing said blank and the paste deposited onto said blank so as to cause said paste to fire through said solid coating and form an ohmic contact at said first surface.

9. A method according to claim 1 wherein said ink has a viscosity in the range of 800 to 10,000 poise at 25 degrees C.

10. A method according to claim 1 wherein said ink is at a temperature in the range of 20 to 60 degrees C.

* * * * *